United States Patent [19]

Nagai

[11] Patent Number: 4,809,068
[45] Date of Patent: Feb. 28, 1989

[54] CLOCK SIGNAL GENERATING CIRCUIT FOR TELEVISION RECEIVER

[75] Inventor: Hiroshi Nagai, Saitama, Japan

[73] Assignee: Kabushiki Kaisha Toshiba, Kanagawa, Japan

[21] Appl. No.: 157,385

[22] Filed: Feb. 18, 1988

[30] Foreign Application Priority Data

Feb. 18, 1987 [JP] Japan ............................ 62-23401[U]

[51] Int. Cl.$^4$ .......................... H04N 5/04; H04N 5/06
[52] U.S. Cl. .................................... 358/148; 358/150;
    358/153; 358/158; 331/20; 307/516; 375/118;
    375/120
[58] Field of Search ............... 358/148, 149, 150, 153,
    358/154, 158, 319, 320, 337; 331/18, 20, 25;
    375/108, 111, 118, 119, 120; 307/511, 516, 525,
    526, 527; 328/63, 72, 74

[56] References Cited

U.S. PATENT DOCUMENTS

| | | | |
|---|---|---|---|
| 3,991,270 | 11/1976 | van Straaten et al. | 358/158 |
| 4,144,545 | 3/1979 | Fernsler et al. | 358/158 |
| 4,228,463 | 10/1980 | Steckler et al. | 358/158 |
| 4,245,251 | 1/1981 | Steckler et al. | 358/158 |
| 4,253,116 | 2/1981 | Rodgers, III | 358/158 |
| 4,488,103 | 2/1985 | Aschwanden | 358/158 |
| 4,647,970 | 3/1987 | Sumiyoshi | 358/158 |
| 4,660,080 | 4/1987 | Dietz et al. | 358/158 |
| 4,729,024 | 3/1988 | Kawai et al. | 358/158 |

Primary Examiner—James J. Groody
Assistant Examiner—Michael D. Parker
Attorney, Agent, or Firm—Helfgott & Karas

[57] ABSTRACT

A clock signal generating circuit for a television receiver, which generates a composite synchronizing signal and a masking signal for controlling the operation of the circuit, the composite synchronizing signal including at least two partial signals. The circuit includes a voltage controlled oscillator for generating an output oscillation signal having a predetermined frequency, a source for supplying a reference voltage corresponding to a predetermined center frequency of the oscillation signal to the oscillator, a phase comparator for comparing the phase of the oscillation signal output from the oscillator with the phase of one of the two partial signals and generating a phase error signal corresponding to the difference in phase between the oscillation signal and the one of the two partial signals for adjusting the frequency of the oscillation signal, a circuit responsive to the masking signal for interrupting the comparison by the phase comparator for a period of time corresponding to the period of another one of the two partial signals, a switch for interrupting the supply of the reference voltage to the oscillator during the period when the mask circuit is interrupting the comparison, and a device for maintaining the voltage supplied to the oscillator at a level corresponding to the voltage supplied at the time of the interruption by the switch and the mask circuit.

11 Claims, 3 Drawing Sheets

CLOCK SIGNAL GENERATING CIRCUIT FOR TELEVISION RECEIVER

FIELD OF THE INVENTION

The present invention relates generally to a clock signal generating circuit for a television receiver, and more particularly, to a phase-locked loop clock signal generating circuit for a television receiver.

BACKGROUND OF THE INVENTION

Generally, television receivers are provided with a circuit for generating a clock signal in synchronization with a television synchronizing signal. The television synchronizing signal is supplied from a tuner circuit in the television receiver. Recently, the typical clock signal generating circuit has been constituted by a phase-locked loop (referred as PLL hereafter) circuit configuration.

Referring now to FIG. 1, an example of the conventional PLL clock signal generating circuit for a television receiver will be described. FIG. 1 is a block diagram showing the conventional circuit of the PLL clock signal generating circuit.

In FIG. 1, a phase comparator 10, a reference voltage supply circuit 12, a low-pass filter (referred as LPF hereafter) 14, a voltage controlled oscillator (referred as VCO hereafter) 16 and a frequency divider 18 are connected into a loop circuit so that the PLL clock signal generating circuit 20 is constituted. That is, an output terminal 10a of phase comparator 10 is coupled to an input terminal 16a of VCO 16. An output terminal 16b of VCO 16 is coupled to an input terminal 18a of frequency divider 18. An output terminal 18b of frequency divider 18 is coupled to a first input terminal 10b of phase comparator 10. Reference voltage supply circuit 12 and LPF 14 are parallelly connected between the output terminal 10a of phase comparator 10 or input terminal 16a of VCO 16 and a ground terminal 22.

Reference voltage supply circuit 12 is comprised of a resistor 122 and a DC voltage source 124, which are connected in series. Resistor 122 serves to set the loop gain of the PLL clock signal generating circuit 20. DC voltage source 124 supplies a reference voltage VB to VCO 16. The reference voltage VB sets the oscillation frequency F0 of VCO 16 to a prescribed center oscillation frequency Fc.

VCO 14 is comprised of a resistor 142 and a capacitor 144 which are connected in series. Resistor 142 and capacitor 144 set the filter characteristics of VCO 14. Accordingly, VCO 14 takes out an AC component imposed on S10, which leaks from Sc through phase comparator 10, with the filter characteristics.

Phase comparator 10 is further provided with second and third input terminals 10c and 10d. First input terminal 10b is provided for receiving a fed-back signal from frequency divider 18. Second input terminal 10c and third input terminal 10d are provided for receiving a composite synchronizing signal Sc and a masking signal Sm, respectively, from a conventional tuner section (not shown) of a television receiver.

The composite synchronizing signal Sc is comprised of at least two partial signals, e.g., a horizontal synchronizing signal Sh and a vertical synchronizing signal Sv. Typically, the composite synchronizing signal Sc further includes an equalizing signal Se. Masking signal Sm is a pulse signal corresponding to the period of the vertical synchronizing signal Sv or the period of the equalizing signal Se and the vertical synchronizing signal Sv.

The output signal of PLL clock signal generating circuit 20 is an oscillation output S16 from output terminal 16b of VCO 16. Oscillation signal S16 has the center frequency Fc, which is N (a positive integer) times the frequency Fh of horizontal synchronizing signal Sh. In an NTSC system television receiver, Fh is 15.75 KHz. Further, for example, the value of N is set to 2,048. Thus, PLL clock signal generating circuit 20 generates a clock signal with a frequency of 32,256 MHz. The clock signal generated by PLL clock signal generating circuit 20 is conventionally used for clock control of various digital circuits in the television receiver.

The frequency Fo of the oscillation signal S16 is divided to 1/N by frequency divider 18, so that the fed-back signal S18 from frequency divider 18 has the same frequency Fh as the horizontal frequency Fh of the horizontal synchronizing signal Sh in the composite synchronizing signal Sc.

Phase comparator 10 compares the phases of the fed-back signal S18 and the composite synchronizing signal Sc supplied to first input terminal 10b and second input terminal 10c, respectively. However, the operation of phase comparator 10 is masked during the period of equalizing signal Se and vertical synchronizing signal Sv by masking signal Sm supplied to third input terminal 10d, so that phase comparator 10 actually compares the phase Ph of horizontal synchronizing signal, Sh with the phase P18 of fed-back signal S18. Phase comparator 10 outputs a phase error signal S10 as a DC current in response to a phase error $\Delta P$ between Ph and P18.

Phase comparator 10 is comprised of a phase error detection circuit 102, a current supply source 104 and a current extraction source 106. Phase error detection circuit 102 activates current supply source 104 when fed-back signal S18 delays in phase in comparison to horizontal synchronizing signal Sh. Current supply source 104 supplies a DC current to input terminal 16a of VCO 16. The DC current flows into capacitor 144. Capacitor 144 has been previously charged to reference voltage VB by DC voltage source 124 in reference voltage supply circuit 12. As a result, the voltage VA of input terminal 16a of VCO 16 becomes higher than VB.

Phase error detection circuit 102 activates current extraction source 106 when fed-back signal S18 advances in phase in comparison to horizontal synchronizing signal Sh. Current extraction source 106 extracts a DC current from input terminal 16a of VCO 16. The extraction of the DC current reduces the charge of capacitor 144, so that the voltage VA on input terminal 16a becomes lower than VB.

The voltage VA caused by the current supply or the current extraction operates to adjust the frequency Fo of the oscillation signal S16 of VCO 16 to the prescribed center frequency Fc.

Both current supply source 104 and current extraction source 106 are deactivated when phase error $\Delta P$ is zero. At this time, voltage VA is equal to reference voltage VB, so that VCO 16 oscillates at the prescribed center frequency Fc.

As mentioned above, the oscillation frequency Fo of oscillation signal S16 output from VCO 16 varies in response to voltage VA. The variation of the oscillation frequency Fo is negatively fed-back to phase comparator 10 through frequency divider 18. As a result, the oscillation frequency Fo of PLL clock signal generating circuit 20 is servo-controlled, so as to restore the prescribed center frequency Fc if the frequency the oscillation frequency Fo is disturbed by various factors, such as a temperature change.

This conventional clock signal generating circuit for a television receiver has a drawback, as described below.

The operation of phase comparator 10 is masked by masking signal Sm for the periods corresponding to equalizing signal Se and vertical synchronizing signal Sv, as mentioned above. The masking operation for phase comparator 10 is to prevent a malfunction of phase comparator 10 due to equalizing signal Se and vertical synchronizing signal Sv. If the PLL clock signal generating circuit 20 operates during the periods of equalizing signal Se and vertical synchronizing signal Sv, phase comparator 10 responds to undesired signals, i.e., equalizing signal Se and vertical synchronizing signal Sv, not but to the desired signal, i.e., horizontal synchronizing signal Sh. As a result, the oscillation frequency Fo of oscillation signal S16 output from the PLL clock signal generating circuit 20 varies enormously to follow the frequency of equalizing signal Se or vertical synchronizing signal Sv. However, a malfunction of the PLL clock signal generating circuit 20 is prevented by masking signal Sm. The idea of masking phase comparator 10 for the period of equalizing signal Se and vertical synchronizing signal Sv is described in Japanese Patent Disclosure No. P 61-145969, the disclosure of which is hereby incorporated by reference.

Masking signal Sm deactivates phase comparator 10 for the period Tm of equalizing signal Se and vertical synchronizing signal Sv. In other words, phase comparator 10 is disconnected from reference voltage supply circuit 12, VCO 14 and VCO 16 during the masking period Tm. If voltage VA on input terminal 16a of VCO 16 differs from reference voltage VB just before the masking operation, voltage VA gradually approaches the reference voltage VB.

The variation of voltage VA will be described in detail below, in reference to FIG. 2. FIG. 2 is a graph showing the variation of voltage VA. The horizontal axis of the graph is a time axis. On the time axis, ta and tb represent starting and ending times of the masking period Tm. The vertical axis of the graph shows the amounts of voltage VA and the reference voltage VB.

Voltage VA is charged on capacitor 144 in LPF 14. If voltage VA has a value VAh, which is higher than reference voltage VB (VA>VB), just before the masking operation, voltage VA has the value VAh at the starting time ta. Voltage VA then decreases from the value VAh towards the reference voltage VB. This is because voltage VA is discharged through resistors 142, 122 and DC voltage source 124. The variation of voltage VA in this case is shown by Graph Gh. The discharge is carried out at a relatively slow rate based on a large time constant TCa, which is defined by the resistances R142, R122 of resistors 142, 122 and the capacitance C144 of capacitor 144. The time constant TCa for the discharge operation is expressed as follows:

TCa=(R142+R122)·C144

Therefore, voltage VA decreases gradually for the masking period Tm, as shown by a portion Gha of Graph Gh.

When the ending time tb has been reached, phase comparator 10 is activated. That is, phase comparator 10 is again connected to reference voltage supply circuit 12, LPF 14 and VCO 16. Therefore, capacitor 144 in PLL 14 is charged by the DC current supplied from current supply source 104 in phase comparator 10. The capacitor 144 is charged at a relatively fast rate according to a small time constant TCb, which is defined by the resistance R142 of resistor 142 and the capacitance C144 of capacitor 144. The time constant TCb for the charge operation is expressed as follows:

TCb=R142·C144

Voltage VA then increases to the value VAh very fast just after the ending time tb, as shown by a portion Ghb of Graph Gh.

After voltage VA has reached the value VAh, voltage VA is maintained around the value VAh, as shown by a portion Ghc of Graph Gh.

On the contrary, if voltage VA has a value VAl, which is lower than reference voltage VB (VA<VB), just before the masking operation, voltage VA has the value VAl at the starting time ta. Voltage VA then increases from the value VAl towards the reference voltage VB. This is because the DC current supplied from DC voltage source 124 is charged into capacitor 144 through resistors 122 and 142. The variation of voltage VA in this case is shown by Graph Gl. The charge is carried out at the time constant TCa. Therefore, voltage VA increases gradually for the masking period Tm, as shown by a portion Gla of Graph Gl.

When the ending time tb has come, phase comparator 10 is activated. That is, phase comparator 10 is again connected to reference voltage supply circuit 12, PLL 14 and VCO 16. Therefore, current extraction source 106 of phase comparator 10 extracts the DC current from input terminal 16a of VCO 16. The current extraction is carried out by the discharge of capacitor 144 in PLL 14. The discharge is carried out at the time constant TCb. Therefore, voltage VA then decreases to the value VAl very fast just after the ending time tb, as shown by a portion Glb of Graph Gl.

After voltage VA has reached the value VAl, voltage VA is kept around the value VAl, as shown by a portion Glc of Graph Gh.

As mentioned above, voltage VA changes to the value VAh or VAl very fast, after the masking operation has been completed. However, VCO 16 cannot follow such a very fast change of voltage VA at the time when the masking operation has finished. As a result, the oscillation frequency Fo of the PLL clock signal generating circuit 20 becomes unstable. This adversely affects the operation of PLL clock signal generating circuit 20 for generating stable clock signals.

SUMMARY OF THE INVENTION

Accordingly, an object of the present invention is to provide a clock signal generating circuit which can consistently generate a stable clock signal.

Another object of the present invention is to provide a clock signal generating circuit which does not cause freuency fluctuation for the generated clock signal even when the phase comparison operation is stopped temporarily.

In order to achieve the above objects, a clock signal generating circuit for a television receiver, which generates a composite synchronizing signal and a masking signal for controlling the operation of the circuit, the composite synchronizing signal including at least two partial signals, includes a voltage controlled oscillator for generating an output oscillation signal having a predetermined frequency, a source for supplying a reference voltage corresponding to a predetermined center frequency of the oscillation signal to the oscillator, a phase comparator for comparing the phase of the oscillation signal output from the oscillator with the phase of one of the two partial signals and generating a phase error signal corresponding to the difference in phase between the oscillation signal and the one of the two partial signals for adjusting the frequency of the oscillation signal, a circuit responsive to the masking signal for interrupting the comparison by the phase comparator for a period of time corresponding to the period of another one of the two partial signals, a switch for interrupting the supply of the reference voltage to the oscillator during the period when the mask circuit is interrupting the comparison, and a device for maintaining the voltage supplied to the oscillator at a level corresponding to the voltage supplied at the time of the interruption by the switch and the mask circuit.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
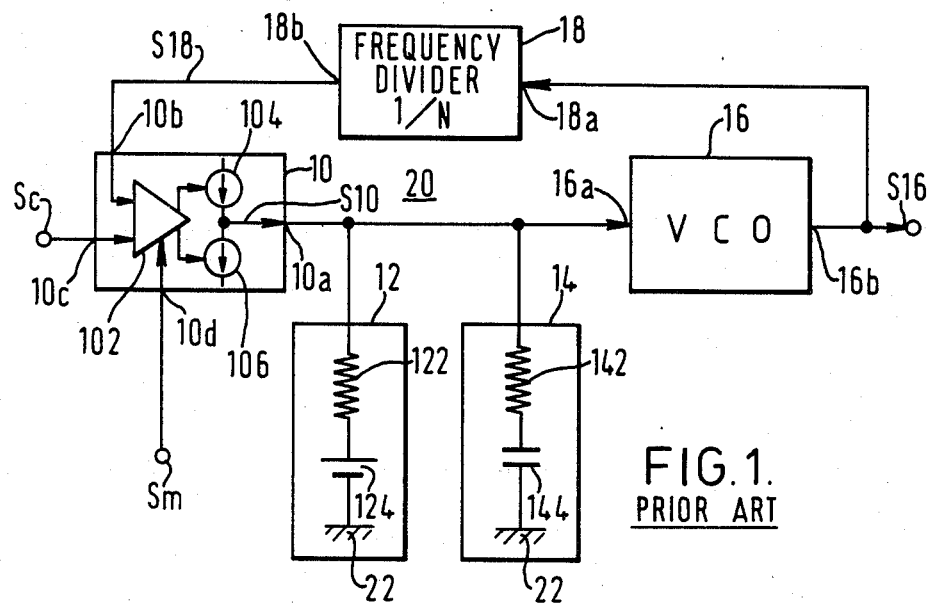
FIG. 1 is a block diagram showing a conventional clock signal generating circuit for a television receiver.
Figure 2:
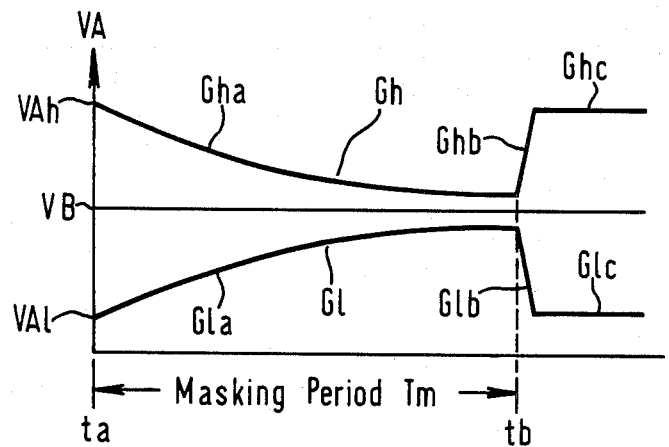
FIG. 2 is a graph diagram for explaining the operation of the circuit of FIG. 1.

The present invention will be described in detail with reference to the accompanying drawings, namely, FIGS. 3 and 4. Throughout the drawings, like reference numerals or letters are used to designate elements like or equivalent to those used in FIG. 1 (Prior Art) for the sake of simplicity of explanation.

Figure 3:
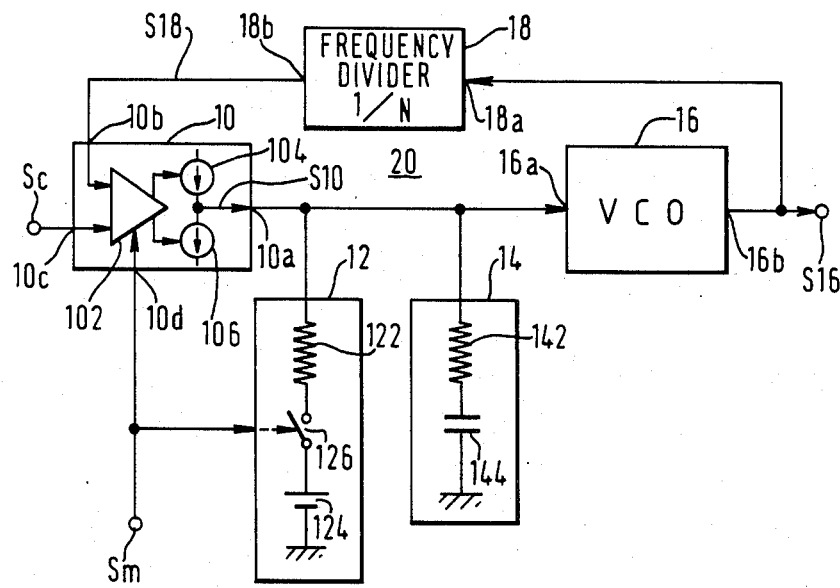
FIG. 3 is a block diagram showing an embodiment of a clock signal generating circuit for a television receiver according to the present invention.

Referring now to FIG. 3, an embodiment of the clock signal generating circuit for a television receiver according to the present invention will be described in detail. FIG. 3 shows a block diagram of the clock signal generating circuit.

The embodiment shown in FIG. 3 is different from the conventional one shown in FIG. 1, in that the reference voltage supply circuit for defining the center oscillation frequency also is masked during the period of the equalizing signal and the vertical synchronizing signal, as described in detail below.

In FIG. 3, a phase comparator phase comparator 10, a reference voltage supply circuit 12, an LPF 14, a VCO 16 and a frequency divider 18 are connected into a loop circuit, so that the PLL clock signal generating circuit 20 is constituted. That is, an output terminal 10a of phase comparator 10 is coupled to an input terminal 16a of VCO 16. An output terminal output terminal 16b of VCO 16 is coupled to an input terminal 18a of frequency divider 18. An output terminal 18b of frequency divider 18 is coupled to a first input terminal 10b of phase comparator 10. Reference voltage supply circuit 12 and PLL 14 are parallelly connected between the output terminal 10a of phase comparator 10 or input terminal 16a of VCO 16 and a ground terminal 22.

Reference voltage supply circuit 12 is comprised of a resistor 122, a DC voltage source 124 and a switch 126 which are connected in series. Resistor 122 serves to set the loop gain of the PLL clock signal generating circuit 20. DC voltage source 124 supplies a reference voltage VB to VCO 16. The reference voltage VB sets the oscillation frequency the oscillation frequency Fo of VCO 16 to a prescribed center oscillation frequency Fc. Switch 126 has a control terminal 126a, which is provided for receiving the masking signal Sm, as described below.

PLL 14 is comprised of a resistor 142 and a capacitor 144, which are connected in series. Resistor 142 and capacitor 144 set the filter characteristics of PLL 14. Accordingly, PLL 14 filters out the AC component imposed on the phase error signal S10, which leaks from the composite synchronizing signal Sc and/or the fed-back signal S18 through phase comparator 10, with the filter characteristics.

Phase comparator 10 is further provided with second input terminal 10c and third input terminal 10d. First input terminal 10b is provided for receiving a fed-back signal from frequency divider 18. Second input terminal 10c and third input terminal 10d are provided for receiving a composite synchronizing signal Sc and the masking signal Sm, respectively, from a conventional tuner section (not shown) of a television receiver. The composite synchronizing signal Sc is comprised of at least two partial signals, e.g., a horizontal synchronizing signal Sh and a vertical synchronizing signal Sv. Typically, the composite synchronizing signal Sc further includes an equalizing signal Se. Masking signal Sm is a pulse signal corresponding to the period of the vertical synchronizing signal Sv or the period of the equalizing signal Se and the vertical synchronizing signal Sv.

The output signal of the PLL clock signal generating circuit 20 is an oscillation signal S16 of VCO 16. The oscillation signal S16 has the center frequency Fc, which is N (a positive integer) times the frequency Fh of the horizontal synchronizing signal Sh. In the NTSC system television receiver, Fh is 15.75 KHz, as mentioned above. Further, for example, the value of N is set to 2,048. Thus, the PLL clock signal generating circuit 20 generates a clock signal with a frequency of 32,256 MHz. The clock signal generated by PLL clock signal generating circuit 20 is conventionally used for a clock control of various digital circuits in the television receiver, as mentioned above.

The frequency Fo of the oscillation signal S16 is divided to 1/N by frequency divider 18, so that the fed-back signal S18 from frequency divider 18 has a frequency the same as the frequency Fh of the horizontal synchronizing signal Sh in the composite synchronizing signal Sc.

Phase comparator 10 compares the phases of the fed-back signal fed-back signal S18 and the composite synchronizing signal Sc supplied to first input terminal 10b and second input terminal 10c, respectively. However, the operation of phase comparator 10 is masked during the period of equalizing signal Se and vertical synchronizing signal Sv by masking signal Sm supplied to third input terminal 10d. Thus, phase comparator 10 actually compares the phase Ph of horizontal synchronizing signal Sh with the phase P18 of fed-back signal S18. Phase comparator 10 outputs a phase error signal S10 as a DC current in response to a phase error phase error ΔP between the phase Ph of horizontal synchronizing signal Sh and the phase P18 of fed-back signal S18.

Phase comparator 10 is comprised of a phase error detection circuit 102, a current supply source 104 and a current extraction source 106. Phase error detection circuit 102 activates current supply source 104 when fed-back signal S18 delays in phase in comparison to horizontal synchronizing signal Sh. Current supply source 104 supplies a DC current to input terminal 16a of VCO 16. The DC current flows into capacitor 144. Capacitor 144 has been previously charged to reference voltage VB by DC voltage source 124 in reference voltage supply circuit 12. As a result, the voltage VA of input terminal 16a of VCO 16 becomes higher than the reference voltage VB.

Phase error detection circuit 102 activates current extraction source 106 when fed-back signal S18 advances in phase in comparison to horizontal synchronizing signal Sh. Current extraction source 106 extracts a DC current from input terminal 16a of VCO 16. The extraction of the DC current reduces the charge of capacitor 144 so that the voltage VA on input terminal 16a becomes lower than the reference voltage VB.

Both of current supply source 104 and current extraction source 106 are deactivated when phase error ΔP is zero. At this time, voltage VA is equal to reference voltage VB, so that VCO 16 oscillates at center oscillation frequency Fc.

As mentioned above, the oscillation frequency Fo of oscillation signal S16 output from VCO 16 varies in response to voltage VA. The variation of the oscillation frequency Fo is negatively fed-back to phase comparator 10 through frequency divider 18. As a result, the oscillation frequency Fo of PLL clock signal generating circuit 20 is servo-controlled so as to restore the prescribed center frequency Fc if the frequency the oscillation frequency Fo is disturbed by various factors, such as the temperature change.

The operation of phase comparator 10 is masked by masking signal Sm for the periods corresponding to equalizing signal Se and vertical synchronizing signal Sv. The masking operation for phase comparator 10 is to prevent a malfunction of phase comparator 10 due to equalizing signal Se and vertical synchronizing signal Sv, as mentioned above. As a result, phase comparator 10 is disconnected from reference voltage supply circuit 12, PLL 14 and VCO 16 during the masking period Tm.

In this embodiment, masking signal Sm is also supplied to switch 126 of reference voltage supply circuit 12. Switch 126 turns OFF when masking signal Sm is supplied thereto. Reference voltage supply circuit 12 is then disconnected from the connection to PLL 14 and VCO 16, together with phase comparator 10 during the masking period Tm. Therefore, a path for charging or discharging capacitor 144 of LPF 14, such as reference voltage supply circuit 12, is deactivated during masking period Tm.

If voltage VA on input terminal 16a of VCO 16 differs from reference voltage VB just before the masking operation, the value of voltage VA is maintained as it is. When masking period Tm has passed, phase comparator 10 is activated. That is, phase comparator 10 is again connected to reference voltage supply circuit 12, PLL 14 and VCO 16. At this time, phase comparator 10 again operates to supply voltage VA at the same value s prior to the masking period Tm.

Figure 4:
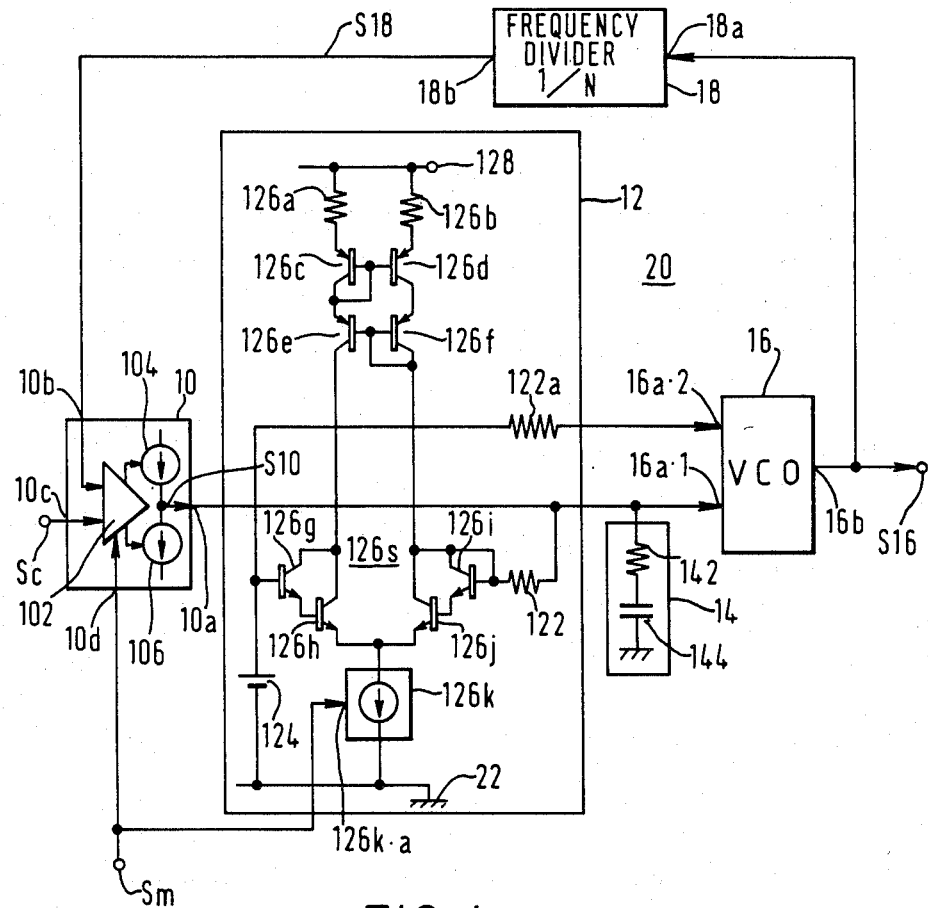
FIG. 4 is a circuit diagram showing a practical circuit construction of the embodiment shown in FIG. 3.

Referring now to FIG. 4, a modification of the PLL clock signal generating circuit according to the present invention will be described. FIG. 4 shows the detail of the reference voltage supply circuit 12 of FIG. 3.

The reference voltage supply circuit 12 of the PLL clock signal generating circuit 20 will be explained in detail hereafter referring to FIG. 4. In FIG. 4, the phase comparator 10, the reference voltage supply circuit 12, the LPF14, the VCO 16 and the frequency divider 18 are coupled to form a loop circuit.

In the reference voltage supply circuit 12, a switch circuit 126s equivalent to the switch 126 of FIG. 3 is formed in a differential amplifier configuration. This switch circuit 126s is coupled between a DC voltage source 124 with the reference voltage VB and a resistor 122.

The differential amplifier type switch circuit 126s includes resistors 126a and 126b, transistors 126c, 126d, 126e, 126f, 126g, 126h, 126i and 126j and a constant current source 126k. The resistors 126a and 126b are each connected at one end to the power supply source line 128, and at the other end to the emitter of the transistors 126c and 126d, respectively.

The transistors 126c and 126e are coupled in series. The transistors 126d and 126f are also coupled in series. The bases of the transistors 126c and 126d are not only coupled to each other but also coupled to the collector of the transistor 126c. Thus, the transistors 126c and 126d form a first current mirror circuit. The bases of the transistors 126e and 126f are not only coupled to each other but also coupled to the collector of the transistor 126f. Thus, the transistors 126e and 126f also form a second current mirror circuit.

The transistors 126g and 126h are connected to form a first Darlington circuit. The transistors 126i and 126j are also connected to form a second Darlington circuit. The first and second Darlington circuits are coupled to form a differential amplifier circuit. In the differential amplifier circuit, the emitters of the transistors 126h and 126j of the first and second Darlington circuits are connected to each other. The collectors of the transistors 126g and 126h in the first Darlington circuit are connected to the collector of the transistor 126e of the second current mirror circuit. The collectors of the transistors 126i and 126j in the second Darlington circuit are connected to the collector of the transistor 126f of the second current mirror circuit. The emitters of the transistors 126h and 126j are further coupled to a ground terminal 22 through the constant current source 126k. The constant current source 126k is provided with a control terminal 126k-a for receiving the masking signal Sm.

The base of the transistor 126g in the switch circuit 126s is coupled to the DC voltage source 124. The base of the transistor 126j in the switch circuit 126s is coupled to the resistor 122.

VCO 16 is of the differential input type in that the VCO 16 is provided with two input terminals 16a.1 and 16a.2. First input terminal 16a.1 of VCO 16 is coupled to the switch circuit 126s through the resistor 122, while second input terminal 16a.2 of VCO 16 is coupled to the DC voltage source 124 through a resistor 122a. Thus, the second input terminal 16a.2 is given the reference voltage VB of the DC voltage source 124. In the operation, the reference voltage VB applied to the second input terminal 16a.2 sets the oscillation frequency F0 of VCO 16 to a prescribed center oscillation frequency Fc. When the voltage VA on the first input terminal 16a.1 differs from the reference voltage VB, the oscillation frequency Fo varies from the center oscillation frequency Fc.

The operation of the switch circuit 126s will be explained hereafter, in reference to FIG. 4.

When masking signal Sm is not supplied to the control terminal 126k.a of the constant current source 126k in the switch circuit 126s, the constant current source 126k supplies a prescribed current to the differential amplifier circuit comprised of the resistors 126a and 126b and the transistors 126c, 126d, 126e, 126f, 126g, 126h, 126i and 126j. Thus, the switch circuit 126s of the differential amplifier type activates. In the activation state, the differential amplifier circuit operates to equalize the base potential of transistors 126i to the base potential of transistors 126g. As a result, the reference voltage VB of the DC voltage source 124 is supplied to the first input terminal 16a.1 of VCO 16 through the switch circuit 126s. The switch circuit 126s of the differential amplifier type has a remarkable efficacy to minimize the potential difference between an input end, such as the base of the transistor 126g, and an output end, such as the base of the transistor 126i.

When masking signal Sm is supplied to the control terminal 126k.a of the constant current source 126k in the switch circuit 126s, constant current source 126k turns OFF. Thus, the switch circuit 126s of the differential amplifier type is deactivated in response to the turn-OFF of the constant current source 126k. Reference voltage supply circuit 12 is then disconnected from the connection to PLL 14 and VCO 16, together with phase comparator 10 during the masking period Tm. Therefore, a path for charging or discharging capacitor 144 of LPF 14, such as reference voltage supply circuit 12, is deactivated during masking period Tm.

Other circuit portions, i.e., phase comparator 10, LPF 14 and frequency divider 18, of the PLL clock signal generating circuit 20 of FIG. 4 are equivalent to those of FIG. 3. Therefore, the operations related to the circuit portions will be omitted hereafter.

According to the present invention, when the operation of phase comparator in a PLL circuit is stopped during a prescribed period, such as the masking period, the reference voltage supplying means is disconnected from the PLL circuit. Therefore, no charging/discharging circuit is formed for the capacitor of the LPF in the PLL. VCO in the PLL is controlled by the voltage held in the capacitor. Therefore, the oscillation frequency of the VCO, immediately before the masking operation, is maintained. As a result, any fluctuation of the oscillation frequency caused by a difference between the reference voltage and the holding voltage will not occur.

As explained in the above, according to the present invention, a stable clock signal can be obtained.

While there has been illustrated and described what are at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teaching of the present invention without departing from the central scope thereof. Therefore, it is intended that this invention not be limited to the particular embodiment disclosed as the best mode contemplated for carrying out this invention, but that the invention include all embodiments falling within the scope of the appended claims.

What is claimed is:

1. A clock signal generating circuit for a television receiver, the receiver generating a composite synchronizing signal and a masking signal for controlling the operation of the circuit, the composite synchronizing signal including at least two partial signals, comprising:
   voltage controlled oscillator means for generating an output oscillation signal having a predetermined frequency;
   means for supplying a reference voltage corresponding to a predetermined center frequency of the oscillation signal to the oscillator means;
   phase comparator means for comparing the phase of the oscillation signal output from the oscillator means with the phase of one of the two partial signals and generating a phase error signal corresponding to the difference in phase between the oscillation signal and the one of the two partial signals for adjusting the frequency of the oscillation signal;
   mask means responsive to the masking signal for interrupting the comparison by the phase comparator means for a period of time corresponding to the period of another one of the two partial signals;
   switch means for interrupting the supply of the reference voltage to the oscillator means during the period when the mask means is interrupting the comparison; and
   means for maintaining the voltage supplied to the oscillator means at a level corresponding to the voltage supplied at the time of the interruption by the switch means and the mask means.

2. A clock signal generating circuit of claim 1 wherein the reference voltage supplying means includes a DC voltage source with the reference voltage and a resistor for setting a gain of the clock signal generating circuit.

3. A clock signal generating circuit of claim 2 wherein the switch means is coupled in series with the reference voltage supplying means.

4. A clock signal generating circuit of claim 3 wherein the switch means is coupled between the DC voltage source and the gain setting resistor.

5. A clock signal generating circuit of claim 4 wherein the voltage maintaining means includes a capacitor responsive to the phase error signal output from the phase comparator means and the reference voltage supplied from the reference voltage supplying means.

6. A clock signal generating circuit of claim 5 wherein the voltage maintaining means further includes a resistor for filtering out the composite synchronizing signal and the oscillation signal leaked from the phase comparator means.

7. A clock signal generating circuit of claim 6 wherein the switch means includes a differential amplifier means.

8. A clock signal generating circuit of claim 7 wherein the differential amplifier means is comprised of a differential circuit with a pair of Darlington coupled transistors and a constant current source with a control terminal connected the masking means.

9. A clock signal generating circuit of claim 8 wherein one of the pair of Darlington coupled transistors is connected to the DC voltage source and the other of the pair of Darlington coupled transistors is connected to the gain setting resistor.

10. A clock signal generating circuit of claim 9 wherein the voltage controlled oscillator means includes a differential input type voltage controlled oscillator.

11. A clock signal generating circuit of claim 9 wherein the differential input type voltage controlled oscillator has one input coupled to the DC voltage source through the gain setting resistor and the differential amplifier means and another input coupled to the DC voltage source through another gain setting resistor.

* * * * *